(12) United States Patent
Friesen et al.

(10) Patent No.: US 7,135,697 B2
(45) Date of Patent: Nov. 14, 2006

(54) SPIN READOUT AND INITIALIZATION IN SEMICONDUCTOR QUANTUM DOTS

(75) Inventors: Mark Gregory Friesen, Middleton, WI (US); Charles George Tahan, Madison, WI (US); Robert James Joynt, Madison, WI (US); Mark A. Eriksson, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 214 days.

(21) Appl. No.: 10/787,075

(22) Filed: Feb. 25, 2004

(65) Prior Publication Data
US 2005/0184285 A1    Aug. 25, 2005

(51) Int. Cl.
*H01L 29/06* (2006.01)
(52) U.S. Cl. .......................................... 257/14; 257/24
(58) Field of Classification Search ................. 257/14, 257/15, 17, 24, 29, 38, 25
See application file for complete search history.

(56) References Cited

U.S. PATENT DOCUMENTS

| | | | |
|---|---|---|---|
| 5,530,263 A | 6/1996 | DiVincenzo | |
| 5,671,437 A | 9/1997 | Taira | |
| 5,844,834 A * | 12/1998 | Risch et al. | 365/150 |
| 6,323,504 B1 * | 11/2001 | Shin et al. | 257/14 |
| 6,369,404 B1 | 4/2002 | Kane | |
| 6,472,681 B1 | 10/2002 | Kane | |
| 6,597,010 B1 | 7/2003 | Eriksson et al. | |
| 6,635,898 B1 * | 10/2003 | Williams et al. | 257/14 |

OTHER PUBLICATIONS

I.H. Chan, et al., "Few-Electron Quantum Dots for Quantum Computing," preprint http://arxiv.org/cond-mat/0309205.

Daniel Loss, et al., "Quantum Computation with Quantum Dots," Physical Review A, vol. 57, No. 1, Jan. 1998, pp. 120-126.

B.E. Kane, "A Silicon-Based Nuclear Spin Quantum Computer," Nature, vol. 393, May 14, 1998, pp. 133-137.

Rutger Vrijen, et al, "Electron-Spin-Resonance Transitors for Quantum Computing in Silicon-Germanium Heterostructures," Physical Review A, vol. 62, 2000, pp. 12306-1-012306-10.

M. Ciorga, et al., "Addition Spectrum of a Lateral Dot from Coulomb and Spin-Blockade Spectroscopy," Physical Review B, vol. 61, No. 24, Jun. 15, 2000, pp. 315-318.

Patrik Recher, et al., "Quantum Dot as Spin Filter and Spin Memory," Physical Review Letters, vol. 85, No. 9, Aug. 28, 2000, pp. 1962-1965.

Michel H. Devoret, et al., "Amplifying Quantum Signals with the Single-Electron Transistor," Nature, vol. 406, Aug. 31, 2000, pp. 1039-1046.

Friesen, M., et al., "Modeling Interactions of Si-Ge Qubits," American Physical Society, Jan. 2001; available at http://www.aps.org/meet/MAR01/baps/abs/S3640004.html.

Jeremy Levy, "Quantum-Information Processing with Ferroelectrically Coupled Quantum Dots," Physical Review A, vol. 64, 2001, pp. 052306-1-052306-7.

Hans-Andreas Engel, et al., "Detection of Single Spin Decoherence in a Quantum Dot via Charge Currents," Physical Review Letters, vol. 86, No. 20, May 14, 2001, pp. 4648-4651.

(Continued)

*Primary Examiner*—Sara Crane
(74) *Attorney, Agent, or Firm*—Foley & Lardner LLP

(57) ABSTRACT

A semiconductor quantum dot device converts spin information to charge information utilizing an elongated quantum dot having an asymmetric confining potential along its length so that charge movement occurs during orbital excitation. A single electron sensitive electrometer is utilized to detect the charge movement. Initialization and readout can be carried out rapidly utilizing RF fields at appropriate frequencies.

24 Claims, 6 Drawing Sheets

OTHER PUBLICATIONS

L.M.K. Vandersypen, et al., "Quantum Computing with Electron Spins in Quantum Dots," arXiv:quant-ph/0207059 v1, Jul. 10, 2002, pp. 1-10.

Mark Friesen, et al., "Practical Design and Simulation of Silicon-Based Quantum-Dot Qubits," Physical Review B 67, 121301(4) (2003), pp. 121301-1-121301-4.

J.M. Elzerman, et al., "Few-Electron Quantum Dot Circuit with Integrated Charge Read Out," Physical Review B 67, 161308(R)(2003), pp. 161308-1-161308-4.

Wei Lu, et al., "Real-Time Detection of Electron Tunneling in a Quantum Dot," *Nature*, 423, 422 (2003).

R. Hanson, et al., "Zeeman Energy and Spin Relaxation in a One-Electron Quantum Dot," Physical Review Letters, vol. 91, No. 19, Nov. 7, 2003, pp. 196802-1-196802-4.

Mark Friesen, et al., "Spin Readout and Initialization in a Semiconductor Quantum Dot," Physical Review Letters, vol. 92, No. 3, Jan. 23, 2004, pp. 037901-1-037901-4.

* cited by examiner

SPIN READOUT AND INITIALIZATION IN SEMICONDUCTOR QUANTUM DOTS

STATEMENT OF GOVERNMENT RIGHTS

This invention was made with United States government support awarded by the following agencies: Army/MRMC DAAD19-01-1-0515. The United States government has certain rights in this invention.

FIELD OF THE INVENTION

This invention pertains generally to the field of semiconductor devices and particularly to semiconductor quantum dot devices that may be utilized in quantum computing.

BACKGROUND OF THE INVENTION

Quantum computing utilizes quantum particles to carry out computational processes. The fundamental unit of quantum information is called a quantum bit or qubit. A qubit can be both a zero and a one at the same time. An example is the spin of an electron, wherein the up or down spin can correspond to a zero, a one, or a superposition of states in which it is both up and down at the same time. Performing a calculation using the electron essentially performs the operation simultaneously for both a zero and a one. Experimental advances in quantum computation have come most rapidly in nuclear magnetic resonance (NMR) and ion-trap systems. The success of few-qubit quantum computation in such systems demonstrates an urgent need for a quantum computing scheme that is scaleable to a large number of qubits. Solid-state qubits are one of the primary candidates. Numerous proposals have been made for solid-state quantum computers. These proposals include the use of nuclear spins as qubits, B. E. Kane, "A Silicon-Based Nuclear Spin Quantum Computer," Nature, Vol. 393 (6681), (1998), pp. 133–137; and the use of electronic spins as quantum dots, DiVincenzo, et al., "Quantum Computers and Quantum Coherence," J. of Magnetism and Magnetic Materials, Vol. 200, (1–3), 1999, pp. 202–218. Potential issues with such proposed systems include individual impurity spins, as well as gate operation and readout methods for the quantum dots.

Spins can be manipulated using a strong DC magnetic field combined with a spatially uniform radio frequency field (e.g., at GHz frequencies). In the presence of a small g-factor gradient, the spins can be addressed individually. Entanglement of one spin with another proceeds by gating the barrier between spins. This gives rise to a time-dependent exchange interaction, $H(t)=J(t)S_1S_2$. A combination of these operations acting in the proper sequence on two qubits will produce a controlled-NOT gate (C-NOT). See, e.g., R. Vrijen, et al., "Electron-Spin Resonance Transistors for Quantum Computing and Silicon-Germanium Heterostructures," Physical Review A, Atomic, Molecular, and Optical Physics, Vol. 62(1), 2000, pp. 012306/1–10.

Quantum computation also can be performed without g-factor tuning and the individual spin rotations via high frequency radiation that g-factor tuning allows. Instead, the time-dependent exchange interaction, $H(t)=J(t)S_1S_2$, can be used in combination with coded qubits, as described in D. P. DiVencenzo, D. Bacon, J. Kempe, G. Burkard, K. B. Whaley, Nature (London) 408, 339 (2002), in which a single qubit is represented by the total wave function of several individual spins. In this way, the exchange interaction alone enables universal quantum computation.

Several approaches have been proposed for the implementation of spin qubits in semiconductors. See, D. Loss, et al., Phys. Rev. A57, 120, (1998); B. E. Kane, Nature (London) 393, 133, (1998); R. Vrijen, et al., Phys. Rev. A62, 012306 (2000); J. Levy, Phys. Rev. A64, 052306 (2001); M. Friesen, et al., Phys. Rev. B 67, 121301-1–4 (2003). Several components of qubit technology have been demonstrated, as discussed in J. M. Elzerman, et al., Phys. Rev. B 67, 161308(R) (2003). However, the combined challenge of preparing, storing and measuring spins is formidable. The measurement of spin qubits is a particular challenge. On the one hand, qubits should be well isolated from their environment to avoid decoherence, and on the other hand, it is necessary to individually couple the qubits to an external measurement device. Qubit initialization involves an additional dissipative coupling to the environment. For quantum computing, it is necessary to initiate such coupling selectively, and with sufficient strength to perform the operations quickly. Indeed, scalable quantum computing relies on fault-tolerant quantum error correction algorithms, involving frequent, parallel measurements, and a steady supply of initialized qubits. P. W. Shor, Proceedings of the 35$^{th}$ Annual Symposium on Foundations of Computer Science, S. Goldwasser, Ed., IEEE Computer Society Press, Los Alamitos, Calif., 1994, pp. 124 et seq.; A. M. Steane, Phys. Rev. A 68, 042322 (2003). Rapid and sensitive quantum measurement techniques involving radio frequency single electron transistors (rf-SETs) have been developed. K. W. Lehnert, et al., Phys. Rev. Lett. 90, 027002 (2003). Rf-SETs have been used to detect the tunneling of individual electrons in semiconductor devices, as discussed in L. Lu, et al., Nature (London) 423, 422 (2003).

Quantum dot architectures have been developed specifically for the purpose of manipulating electron spins for fast and accurate two-qubit operations that serve as universal gates for quantum computations. M. Friesen, et al., (2003) supra. See, also, U.S. Pat. No. 6,597,010. Recent experimental results have shown that decoherence does not pose a fundamental problem for such gate operations. A. M. Tyryshkin, et al., Phys. Rev. B 68, 193207 (2003). Using special qubit geometries as discussed in M. Friesen, et al., Appl. Phys. Lett. 81, 4619 (2002), it should be possible to perform reliable gate operations in silicon quantum dots at rates between about 1 MHz and 1 GHz. It would be desirable to be able to achieve similar speeds and reliable operation for measurement and initialization operations. One technique for converting spin information to charge information is discussed in D. Loss, et al., supra, and the use of single electron transistors to read out the resulting spin state has been proposed by Kane, et al., (1998) supra, who posit spin-dependent charge motion onto impurities in silicon. In I. Martin, et al., Phys. Rev. Lett. 90, 018301 (2003), a scheme is proposed for single spin readout that also converts spin information into charge information in an electron trap near a conducting channel. Resistance of the channel depends on the occupation of the trap, which in turn can be made to depend on the spin.

SUMMARY OF THE INVENTION

In accordance with the present invention, spin information is converted to charge information in a semiconductor quantum dot and a single electron sensitive electrometer such as a single electron transistor is used to read out the resulting charge or orbitals in the quantum dot. Both readout and rapid initialization of the spin state can be achieved. Rapid initialization (as compared to initialization by thermalization) is carried out in a manner that obviates the need for spin-polarized leads or ancillary qubits.

The present invention may be incorporated in various material systems, such as GaAs/AlGaAs and a Si/SiGe heterostructure, in which the active layer is pure strained Si, which minimizes decoherence from spin-phonon coupling. The qubits are gated quantum dots which hold one electron, with a gate geometry which confines the electrons in asymmetric lateral wells, such that orbital excitation results in lateral center-of-charge movement. A magnetic field having a gradient along the length of the quantum dot can be utilized to provide spin state splitting of differing energies in the two orbitals of the electron to facilitate selective excitement of the spin orientation.

Further objects, features and advantages of the invention will be apparent from the following detailed description when taken in conjunction with the accompanying drawings.

DETAILED DESCRIPTION OF THE INVENTION

The present invention may be implemented in various semiconductor material systems. For example only, these material systems include, but are not limited to, Si/SiGe and GaAs—AlGaAs heterostructures, as described in M. Friesen, et al., Phys. Rev. B67, 121301(R) (2003), and in U.S. Pat. No. 6,597,010, incorporated herein by reference. In the Si/SiGe system, the active layer is pure strained Si, which minimizes decoherence from spin-phonon coupling as discussed in C. Tahan, et al., Phys. Rev. B66, 035314 (2002).

Figure 1:
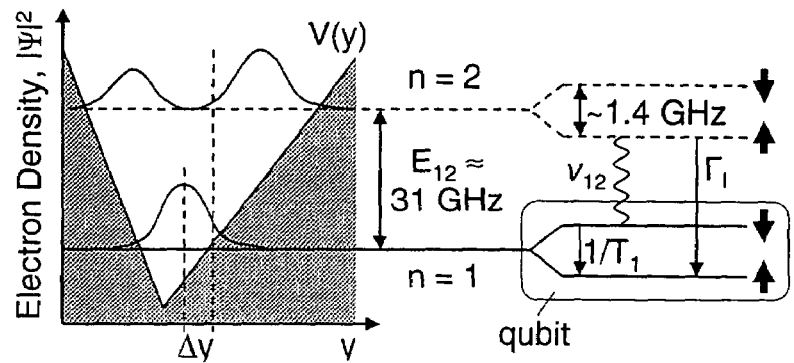
FIG. 1 is a schematic diagram of a one-dimensional, asymmetric confining potential for a quantum dot device in accordance with the invention, in which quantum dot energy states and transition rates for readout and initialization are shown.

In the present invention, the electrons are confined in asymmetric lateral wells, such that orbital excitation results in lateral center-of-charge movement. FIG. 1 shows the first two orbital states of an electron confined to an asymmetric quantum dot, with center-of-charge positions varying by a distance Δy. If an external microwave radiation source of frequency $E_{12}/h$ (where h is Planck's constant), having an energy corresponding to the difference in energy between the two orbitals, is applied to drive the system between the ground state, n=1, and first excited state, n=2, the center-of-charge of the electron will oscillate in time at the Rabi frequency $v_R$. This motion can be detected by a single electron sensitive electrometer, examples of which are a single electron transistor and a quantum point contact. Any other electrometer capable of detecting the change of charge associated with movement of a single electron may be utilized. With the system placed in a magnetic field, charge motion can be generated in a spin-dependent fashion. We define the logical 0 and 1 of the qubit as the spin up and spin down states of the electron in its orbital ground state, and use the orbital excited state only during initialization and readout. The system is now driven at the readout frequency $v_{12}(B)=E_{12}/h-g\mu_B B/h$. This causes charge motion only if the qubit was in the down state at the time of measurement. Although this transition is forbidden at the electric dipole level because of the spin flip, spin-orbit coupling allows for a nonzero transition rate, as described below.

Crucially, this architecture also allows for rapid initialization of the qubit. Consider exposing a random ensemble of qubits to radiation of frequency $v_{12}$. An electron in the $(1,\downarrow)$ state will be excited to the level $(2,\uparrow)$ and will experience a relatively fast relaxation to the ground state $(1,\uparrow)$, as compared to a spin-flip relaxation to the level $(1,\downarrow)$. The net result is to rapidly polarize and thereby initialize the qubit. By varying the gate voltages (and thus $v_{12}$) on individual dots we ensure that only desired qubits are brought into resonance. Clearly, understanding the competition between the three time scales, $1/v_R, 1/\Gamma_I$, and $T_1$, as a function of material parameters and gate potentials is the key to utilizing this device for readout and initialization. Note that $T_1$ represents a thermal initialization time from $(1,\downarrow)$ to $(1,\uparrow)$. Since $T_1$ is a decoherence time, we require $1/v_R \ll T_1$. The Rabi oscillation frequency $v_R$ depends on the incident intensity and is therefore controllable, within limits. Robust measurement requires that many Rabi oscillations occur before orbital decay: $v_R \gg \Gamma_I$.

In order to understand the competition of time scales, we introduce an rms interaction energy, time averaged (as indicated by { }) over an optical cycle, which expresses the strength of the interaction in the electric dipole approximation. This defines the Rabi oscillation frequency: $|\hbar v_R|^2 = \{|V^{E1}|^2\}$. See, B. W. Shore, The Theory of Coherent Atomic Excitation, Wiley, New York, 1990. Here, the $V^{E1} = (-ehE_0/m^*E_{12})\hat{\in}\cdot\rho$ is the dipole term in the Hamiltonian, $|E^0|^2$ is twice the mean value of $|E(t)|^2$ averaged in time, and $\hat{\in}$ is the polarization unit vector. The electric field $E_0$ inside the semiconductor with dielectric constant $\in_r$ is related to the intensity of the external radiation I by $$E_0 = mt;epmrl;\sqrt{2italI/c\in medinf0resetrl};\sqrt{\in infbeginital-renditalresetrlxrlxmx}.$$

The dipole Hamiltonian does not flip the spin directly, but spin-orbit coupling causes each qubit state to be an additive mixture of up and down spin. The cross term gives the nonzero contribution to the matrix element. In the 2D limit, the spin-orbit (SO) Hamiltonian is dominated by the bulk [Dresselaus (D)] and structural [Rashba (R)] inversion asymmetry terms, $H_{so} = H_D + H_R$, where $H_D = \beta(\rho_y\sigma_y - \rho_x\sigma_x)$ and $H_R = \alpha(\rho_x\sigma_y - \rho_y\sigma_x)$. $H_D$ and $H_R$ are approximations used for this pseudo-2D approach but are adequate for purposes of estimation. Including $H_{so}$ perturbatively gives a nonzero dipole matrix element, and for light polarized in the y-direction, the readout frequency is given by $$|v_R| \approx \frac{eE_0}{2\pi h v_{12}(B)}\sqrt{\alpha^2 + \beta^2}|<2|y\partial_y|1\rangle|. \quad (1)$$

Note that the applied radiation need not be circularly polarized for this readout scheme. The Dresselhaus and Rashba parameters $\alpha$ and $\beta$ depend on intrinsic material properties, device design, and external electric field. Both parameters have been derived for narrow-gap materials, specifically GaAs, from Kane-like models. See, E. A. de Andrada e Silva, et al., Phys. Rev. B 55, 16293 (1997). For GaAs, both theoretical and experimental values vary widely: i.e., $\alpha = 1$–$1000$ m/s and $\beta = 1000$–$3000$ m/s. In a centrosymmetric crystal such as silicon which has no bulk inversion asymmetry, $\beta = 0$. The one known data point for a SiGe two-dimensional electron gas gives a $\alpha \cong 8$ m/s, which is used in the estimates below. See, Z. Wilamowski, et al., Phys. Rev. B66, 195315 (2002).

The relaxation of the quantum dot to its ground state enables spin polarization, but this limits or even inhibits readout if it occurs too quickly. This problem has been addressed by Khaetskii and Nazarov in GaAs quantum dots as discussed in A. V. Khaeltskii, et al., Phys. Rev. B61, 12639 (2000). In silicon, where there is no piezoelectric interaction, we calculate the relaxation rate via the golden rule with the usual deformation potential electron-phonon Hamiltonian. See, B. K. Ridley, Quantum Processes in Semiconductors (Oxford Press, New York, 1999), 4$^{th}$ ed. At sufficiently low temperatures (T<1K), optical polar phonons and multiphonon processes do not contribute. By considering only longitudinal phonons, with dispersion $w = v_l q$, and using the long-wavelength approximation $e^{ik\cdot r} \cong 1 + ik\cdot r$, we obtain the orbital decay rate due to electron-lattice coupling:

$$\Gamma_l = \frac{(E_{12})^5}{6\pi\hbar^6 v_l^7 \rho}(\Xi_d + \Xi_u/3)^2 \sum_i |\langle 1|x_i|2\rangle|^2, \quad (2)$$

where $\rho$ is the mass density, and $\Xi_d$ and $\Xi_u$ are the deformation constants. In strained systems, transverse phonons can also be important.

A numerical analysis was performed to obtain performance characteristics for the measurement system. The numerical techniques used are an extension of those used in Friesen, et al. (2003) and Friesen, et al. (2002), supra. The gate potentials, the electronic orbitals, and their corresponding image potentials (arising predominantly from the metallic gates) are computed self-consistently by a combination of three-dimensional finite element and diagonalization techniques. Specifically, we determine the readout oscillation frequency Eq. (1), the orbital decay rate Eq. (2), and the coupling sensitivity of the qubit electron to an integrated SET. One example of such a quantum dot device is shown generally at 20 in FIGS. 2 and 3. Conventional components for applying an appropriate steady state magnetic field and for cryogenic confinement and EMI shielding are not shown in FIGS. 2 and 3. This example device has a 6 nm thick strained silicon quantum well 23 sandwiched between top (or upper) and bottom (or lower) barrier layers 25 and 26 of strain-relaxed silicon-germanium ($Si_{0.85}Ge_{0.15}$). The bottom barrier (30 nm) separates the quantum well from a grounded back-gate 30 formed on a substrate 31 (e.g., of SiGe). The back-gate is a source of electrons for the quantum well. It may be formed, e.g., of highly n-doped silicon-germanium or a second quantum well containing electrons. The top barrier 25 (30 nm) separates the quantum well 23 from lithographically patterned Schottky top-gates 32, whose voltages can be controlled independently. A capping layer (e.g., of Si) can be provided between the top barrier 25 and the gates 32. If desired, a dopant layer, such as P:Si, can be provided from which electrons can be supplied to the quantum well. Other material systems, such as GaAs/AlGaAs may also be used, as illustrated in U.S. Pat. No. 6,597,010, incorporated by reference. Negative potentials on the gates 32, as well as on the SET island 42 and the leads 43, 44, 46 are used to provide lateral confinement of the quantum dot 35 through electrostatic repulsion. Essentially, the quantum dot 35 forms in the region of the quantum well 23 with no gates above it. Thus, it is the geometry of the gates that determines the shape of the dot. The main features of the readout quantum dot 35 are that it is narrow, long, and slightly asymmetric. The narrow feature is provided so that the excited orbitals are non-degenerate, so a microwave field with narrow linewidth will not induce unwanted transitions. The long feature is provided so that the energy splitting $E_{12}$ (and thus $\Gamma_l$) will be small. The asymmetry feature is provided so that excited orbitals will provide charge motion. The latter is achieved in the device of FIG. 2 by patterning the SET island electrodes 42 such that the dot is narrow in this region. An asymmetric confinement potential can also be achieved by applying inhomogeneous voltages to the top-gates 32, or by a combination of geometrical and electrostatic techniques. A typical gate potential is shown in FIG. 4, from which the asymmetry of the dot potential is apparent. The most interesting results are obtained in the regime where the gate and image potentials are comparable in size. The effective confinement potential, including images, is rather complicated due to the inhomogenous gate arrangement. Indeed, it is a very poor approximation to neglect screening in this system. The computed wave functions for the dot are shown in FIG. 4.

Figure 8:
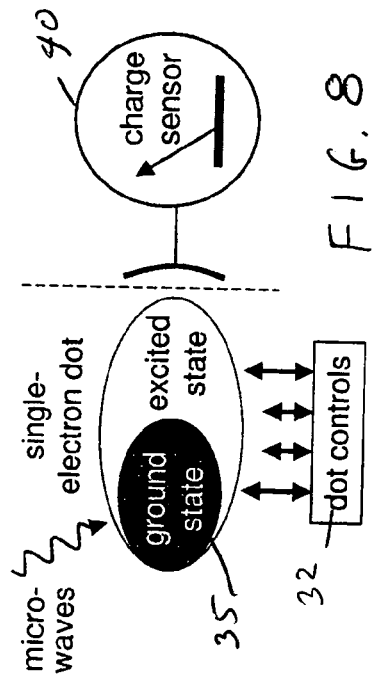
FIG. 8 is a diagram illustrating the coupling of the quantum dot to the readout (charge sensor) circuitry in accordance with the invention.
Figure 9:
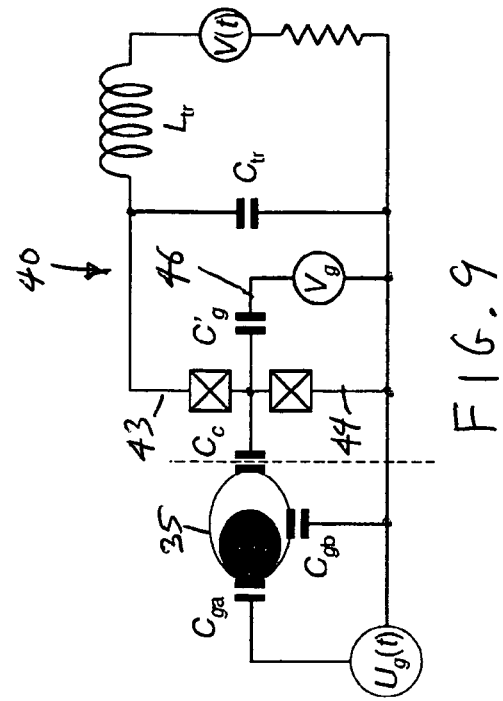
FIG. 9 is a schematic circuit diagram showing the equivalent electrical circuit for the quantum dot and the rf-SET readout circuitry for the quantum dot device of the invention.

To detect charge movement, a single electron sensitive electrometer may be utilized. In the exemplary device 20 of FIGS. 2, a single electron transistor (SET) 40 is incorporated as the readout device. The island 42 of the SET 40 is sheathed by a thin, 2 nm layer of silicon dioxide, and is tunnel-coupled to adjoining source and drain gates 43 and 44. A third, capacitively-coupled gate 46 is placed nearby, to provide full control over both the charge and the potential of the island. When the device is operated in the Coulomb blockade regime, it becomes a single electron sensitive electrometer. The function of this readout device 40 is shown schematically in the diagrams of FIGS. 8 and 9. The capacitive coupling between the dot 35 and the SET island 42 is marked $C_c$ in FIG. 9 and the capacitive coupling between the dot and its control gates is marked $Cg_a$ and $Cg_b$. See, H. M. Devoret, et al., Nature (London) 406, 1039 (2000) for a further explanation of this SET readout device. Microwaves are supplied to the device 20 from a radiator 47 such as a bow-tie antenna fed from a microwave source or signal generator 48. In appropriate arrangements, the source 48 may be connected to one or more of the electrode gates 32 which then function also as the microwave radiator. See, e.g., R. Hanson, et al., Phys. Rev. Lett. 91, 196802 (2003); J. M. Elzerman, et al., Phys. Rev. B67, 161308 (2003). A source 49 of a magnetic field is shown schematically in FIG. 2, and can comprise any desired field source, such as a solenoid (normal or superconducting), permanent magnet, etc., that provides a magnetic field, of appropriate strength, through the dot that is preferably uniform across the quantum dot. In the gate arrangement of FIG. 2, the SET 40 plays two roles. First, voltage control of the island 42 allows the size of the dot 35 to be varied and thus the energy splitting $E_{12}$ to be varied. Second, capacitive coupling to the quantum dot 35 enables detection of its orbital state. The readout scheme works as follows. Since the dot orbitals are spatially distinct, they induce different amounts of charge on the SET island 42. Consequently, transport currents through the SET will reflect the orbital states of the dot. The device exhibits optimal sensitivity if biased at the half-maximum of the conductance peak. The third SET gate 46 is used specifically to adjust this working point. As expected for this geometry, the SET couples most strongly to the excited electronic orbital.

Figure 2:
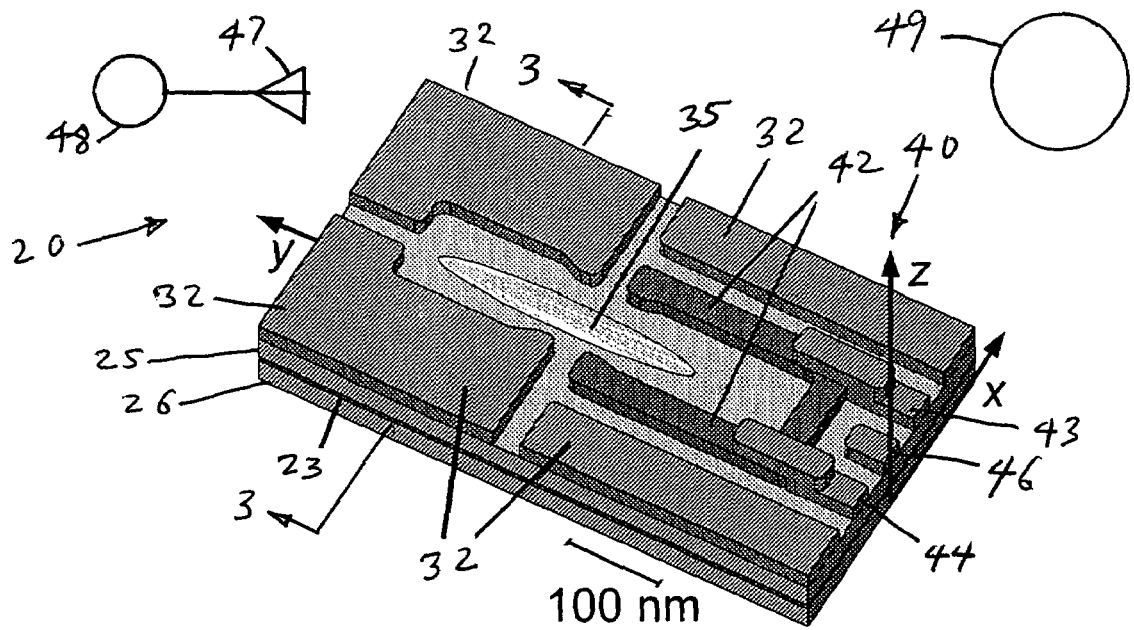
FIG. 2 is a simplified perspective view of a quantum dot spin readout and initialization device in accordance with the invention.
Figure 3:
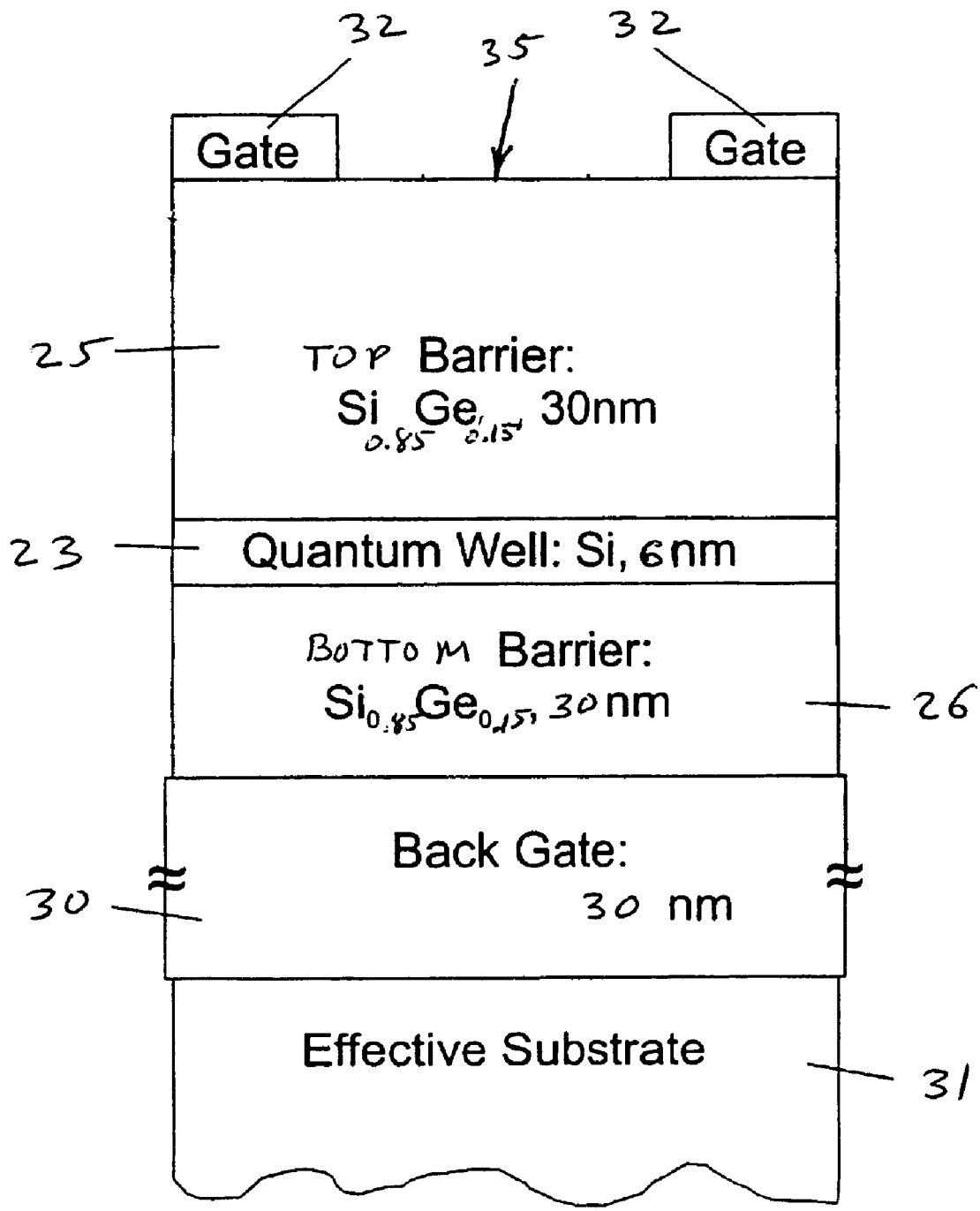
FIG. 3 is a simplified cross-sectional view of an exemplary SiGe semiconductor structure for a device as in FIG. 2 taken generally along the lines 3—3 of FIG. 2.
Figure 4:
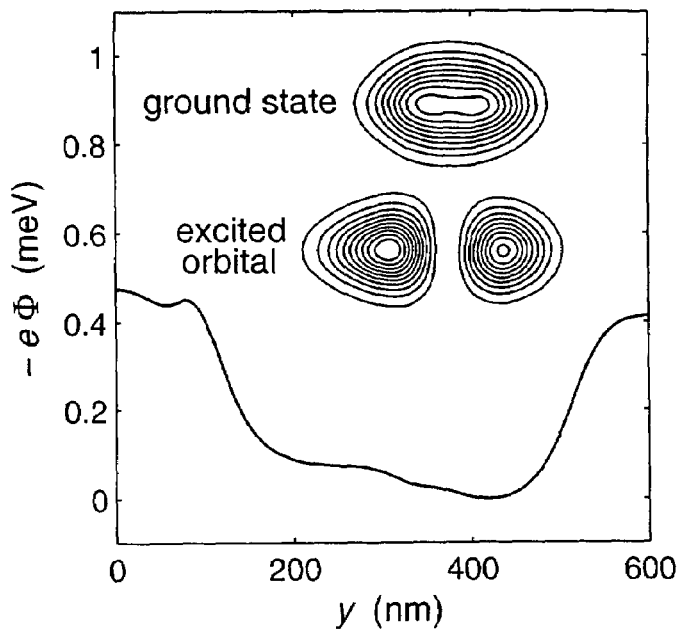
FIG. 4 are diagrams illustrating electrostatic confinement potential and qubit electron wave functions for the device of FIG. 2, with the potential shown obtained in the quantum well along the device symmetry line, x=0, with images not included, and with the contour plots showing the electron probability densities in the x-y plane for the ground state and the excited state.

For the example device shown in FIGS. 2 and 3 we obtain an energy splitting of $E_{12}=0.129$ meV=31.2 GHz between the two lowest orbital states, and the dominant matrix elements $|<1|y|2>|=48$ nm and $|<2|y\partial_y|1>|=3.6$. From these results we obtain the readout oscillation frequency $v_R=5.5\times 10^5 \sqrt{I}$ Hz (for microwave intensity I in units of $W/m^2$), and the orbital decay rate for spontaneous phonon emission $\Gamma_f=12.7$ MHz. The orbital decay rate $\Gamma_y$ for emission of a photon is very much less: $\Gamma_y=e^2 E_{12}{}^3 |<1|y|2>|^2 \sqrt{\in}/3\pi\hbar^{-4}c^3 \in_0{}^{3/2}=6.5$ Hz, and therefore is not a limiting factor in this scheme. All results are obtained at an ambient temperature of T=100 mK and a magnetic field of H=0.05T=1.40 GHz. The dielectric constant of Si is $\in=11.9\in_0$. Note that the natural widths of the states are small compared to their separation. The charge on the SET island was computed by integrating $n\cdot D$ over the surface. The excess or induced charge of the excited quantum dot orbital, relative to its ground state, is found to be $\Delta Q=0.052e$. The corresponding center-of-charge motion in the dot is $\Delta y=4.3$ nm. However, the charge motion does not track closely with $\Delta Q$; the latter is determined primarily by the capacitive coupling between the dot 35 and the SET 40. Finally, we find that by changing the bias voltage on the SET by 20% (thus reducing the dot size), the excitation resonance frequency $v_{12}$ changes by 8 GHz.

Figure 5:
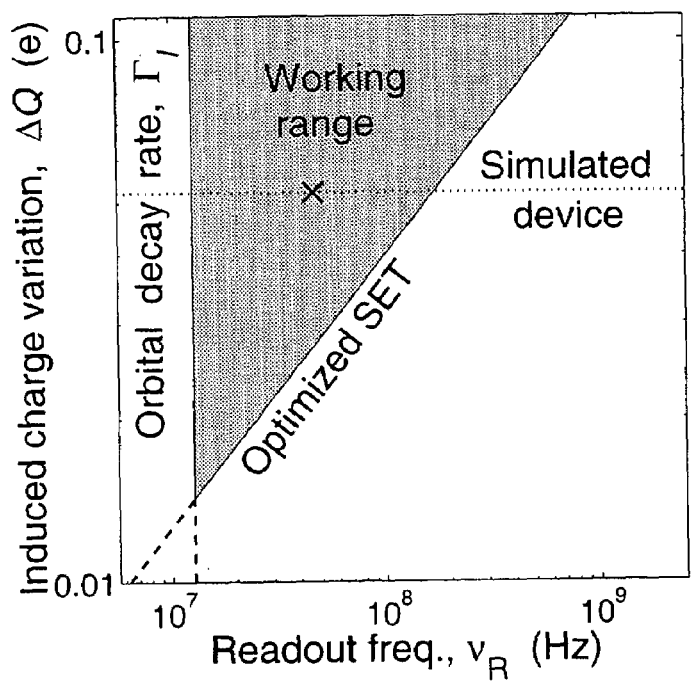
FIG. 5 are graphs showing a summary of operation parameters for the device of FIG. 2, with the shaded region showing the operating range (with constraints set by the sensitivity of the SET and the spontaneous decay rate of the upper readout state), the dotted line showing the actual operating range of the device when the intensity of the incoming radiation is less variable, and with the likely working point of $\upsilon_r$, marked by x, corresponding to a microwave intensity I=7.2 nW/μm².

Initialization and readout in the device 20 are partially summarized in FIG. 5. Theoretical considerations of shot noise place an upper bound of about $4\times10^{-6} e/\sqrt{Hz}$ on the detection sensitivity for charge induced on the island of an optimized rf-SET, as a function of the measurement bandwidth. Similarly, the decay rate of the excited electronic orbital places a lower bound on the readout oscillation frequency $v_R$. The latter is a function of microwave intensity. Achieving $v_R$ in the range of FIG. 5 requires directing microwave power of the order 70 pW onto a dot size of ~0.1×0.1 $\mu m^2$, as consistent with low-temperature transport experiments, with $1/v_R < 1/\Gamma_f$. Sample heating outside the dot can be minimized by focusing power with an integrated on-chip antenna. See, R. Blick, et al., Appl. Phys. Lett. 67, 3924 (1995). Apart from the constraint $1/v_R < 1/\Gamma_f$ set by shot nose and spontaneous decay, we must also satisfy the requirement $T_s >> 1\Gamma_f = 78.7$ ns, where $T_s$ is the spin decoherence time. Theoretical estimates for $T_1$ in Si quantum dots exceed 1 ms. E. A. de Andranda e Silva, supra. Recent work on electron spins in $^{28}$Si:P would imply that $T_s > 60$ ms. Hence the crucial hierarchy of timescales $1/v_R < 1/\Gamma_f << T_s$ is achievable. Estimated measurement times are on the order of $1/v_R \cong 10-100$ ns, compared to a measurement decoherence time of $1/\Gamma_f \cong 100$ ns. The latter corresponds to the time scale for qubit initialization.

The readout scheme described above may require a relatively large microwave field to be able to operate at acceptable speeds for cycling between the states $(1\downarrow)$ and $(2\uparrow)$. It is generally undesirable to use large microwave fields, since this heats the sample. Quantum computing devices typically must be operated at very low temperatures, near absolute zero. However, using less intense fields causes the operation of the device to slow down. In the present invention, orbital excitation is accomplished by applying a microwave signal at an energy (i.e., wavelength) equal to the energy splitting between the two cycling states, $E_{2\uparrow}-E_{1\downarrow}$. The reason this transition is slow is that it involves a spin flip. In fact, the process is classically forbidden, and would not occur at all, except for the presence of spin-orbit coupling, which mixes the spin states a little. To increase the oscillation speed, it is preferable to excite the electron from orbital 1 to orbital 2 without a spin flip. This is not possible in the device of FIG. 2, because in that case, same-spin orbital excitations $(1\uparrow) \rightarrow (2\uparrow)$ and $(1\downarrow) \rightarrow (2\downarrow)$ had the same energy, i.e., $(E_{2\uparrow}-E_{1\uparrow}) = (E_{2\downarrow}-E_{1\downarrow})$. Thus, same-spin excitations could not be controlled spin-selectively. For this reason, the spin flip transition, $(1\downarrow) \rightarrow (2\uparrow)$ is used in the device of FIG. 7, since its energy is unique.

Figure 6:
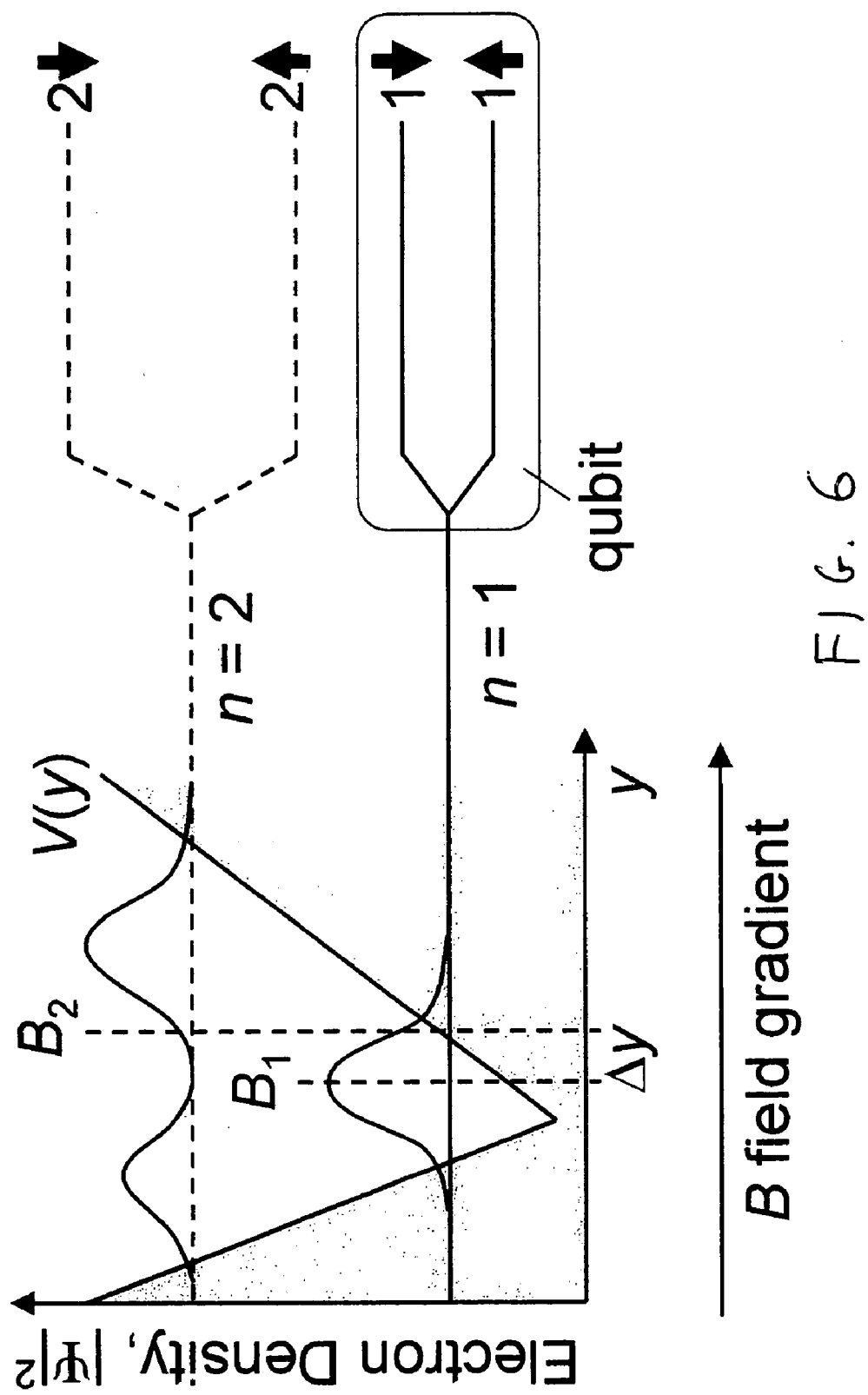
FIG. 6 is a schematic diagram of a one-dimensional asymmetric confining potential for another embodiment of a quantum dot device in accordance with the invention having readout enhancement utilizing an inhomogeneous magnetic field.

To decrease the need to use relatively intense microwaves (or conversely, to enhance the speed of readout), device architecture may be utilized that makes the spin splittings distinct in different orbitals. This is accomplished by providing magnetic field gradient across the device in the y direction. Recall that the two orbitals, 1 and 2, have different centers of mass. Because the two orbital states are centered at different positions in the magnetic field, they feel different magnetic fields $B_1$ and $B_2$, as illustrated in FIG. 6. The spin splitting is proportional to the local magnetic field, so the spin splittings for the two orbitals will be different. In particular, same-spin transitions now have different energies: $(E_{2\uparrow}-E_{1\uparrow}) \neq (E_{2\downarrow}-E_{1\downarrow})$. Thus, distinct microwave energies can be used to selectively excite either $(1\uparrow)$ or $(1\downarrow)$, without flipping the spin. This speeds up the excitation speed by a factor of 200–1000.

Figure 7:
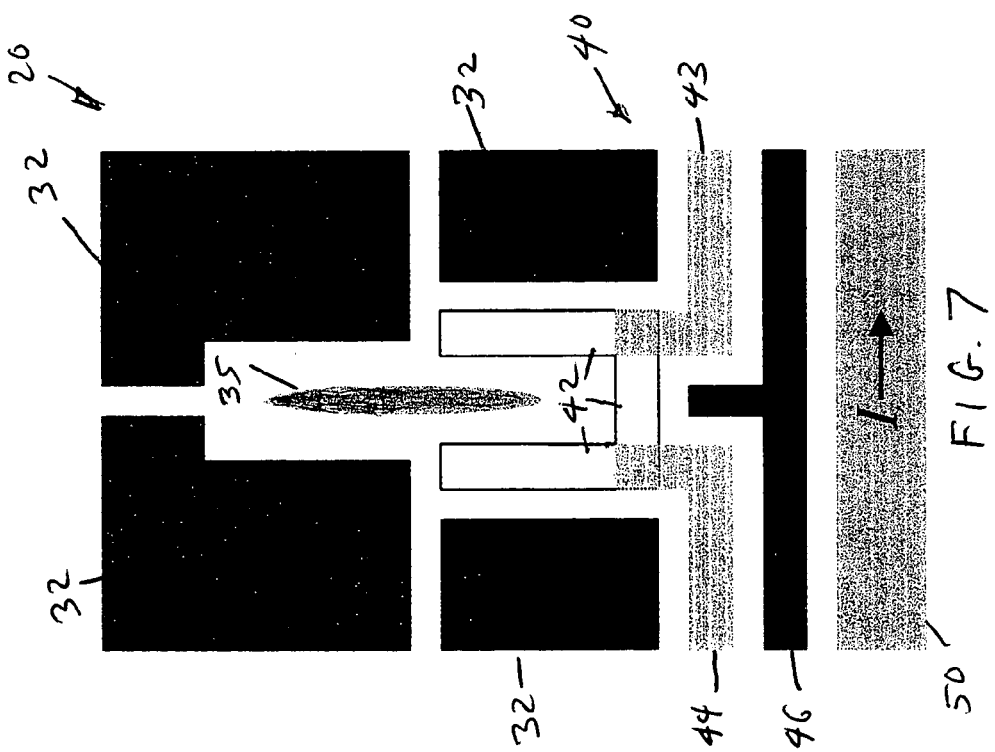
FIG. 7 is a simplified plan view of a quantum dot spin readout and initialization device in accordance with the invention having an enhanced readout utilizing an inhomogeneous magnetic field.

To obtain a magnetic field gradient, a wire 50 can be patterned on the same device as the quantum dot as shown in FIG. 7. The wire is oriented perpendicular to the length of the quantum dot. Current is passed through this wire 50 to generate a magnetic field that decays as $1/r$, where r is the distance from the wire. In order for this technique to work, the difference between the spin splittings in orbitals 1 and 2 should be greater than the intrinsic width of the different states, which is determined by decoherence processes. Typical currents carried by thee patterned wire 50 are about 1 mA. A uniform magnetic field of appropriate strength may also be provided.

Figure 10:
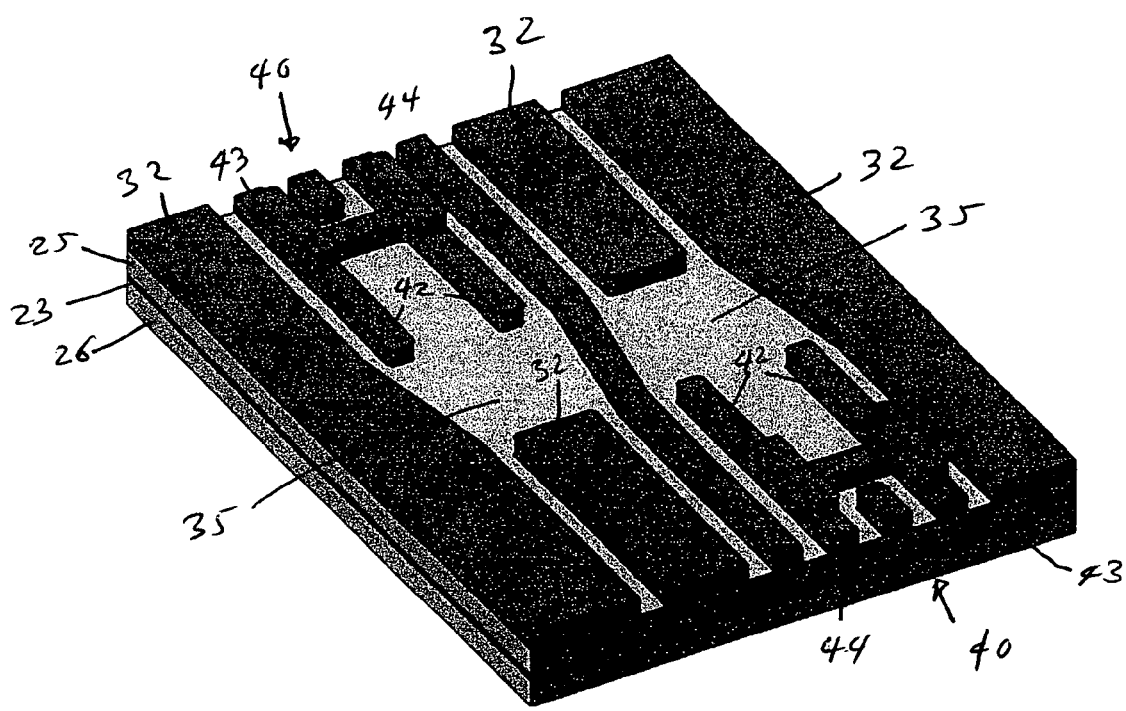
FIG. 10 is a simplified perspective view of an exemplary manner in which multiple quantum dot spin readout and initialization devices may be implemented in accordance with the invention.

FIG. 10 illustrates the manner in which a multiple quantum dot device may be formed having plural quantum dot devices adjacent to one another in a row. As shown in FIG. 10, each quantum dot device can share gate electrodes 32 with the device next to it. The same gates 32 used to control a given dot 35 can also be used to control its size. This, in turn, allows control of the splitting between ground and excited states independently for each dot. Thus, a given dot can be selected to be brought into resonance with the external microwave field. Only dots in resonance with the microwaves will be activated for readout.

It is understood that the invention is not limited to the embodiments set forth herein as illustrative, but embraces all such forms thereof as come within the scope of the following claims.

What is claimed is:

1. A semiconductor quantum dot device comprising:
   (a) a multilayer semiconductor structure including a substrate, a back gate electrode layer, a quantum well layer, a bottom barrier layer between the quantum well layer and the back gate layer, and a top barrier layer above the quantum well layer;
   (b) a plurality of spaced electrode gates formed on the multilayer semiconductor structure, the electrode gates spaced from each other by a region beneath which the quantum dot may be defined, the electrodes formed to provide a quantum dot having an elongated length and a narrow width and an asymmetric confining potential along its length such that orbital excitation of an electron in the quantum dot results in lateral center of charge motion; and
   (c) a single electron sensitive electrometer adjacent to the quantum dot and coupled thereto to detect the change in charge resulting from the lateral movement of the center of charge of an electron changing orbitals in the quantum dot.

2. The device of claim 1 further including a conductor on the semiconductor structure arranged to carry current in a direction perpendicular to the length of the quantum dot such that current carried by the conductor provides a magnetic field that extends through the quantum dot with a gradient in magnetic field along the length of the quantum dot.

3. The device of claim 1 wherein the multilayer semiconductor structure is a heterostructure.

4. The device of claim 1 wherein the single electron sensitive electrometer comprises a single electron transistor.

5. The device of claim 1 further including a microwave radiator and a microwave source connected to the radiator to provide a microwave field to the quantum dot.

6. The device of claim 5 wherein the microwave generator provides microwaves at a frequency which provides microwave energy equal to the energy splitting between the two orbitals of an electron in the quantum dot.

7. The device of claim 6 further including means for providing a magnetic field through the quantum dot which has a gradient along the length of the quantum dot such that the two orbitals of an electron in the quantum dot have different spin splittings, and wherein the microwave generator provides microwaves at a frequency having an energy selected from the group consisting of the difference between the energy in the two orbitals of up direction spin and the difference between the energy in the two orbitals of down direction spin.

8. The device of claim 5 wherein the microwave source is connected to at least one electrode gate which acts as the microwave radiator.

9. The device of claim 1 wherein the back gate layer is formed of highly doped semiconductor or a quantum well containing electrons.

10. The device of claim 1 further including a source of a magnetic field through the quantum dot that is uniform across the quantum dot.

11. The device of claim 1 wherein the quantum well layer is formed of silicon and the top and bottom barrier layers are formed of silicon-germanium.

12. The device of claim 11 wherein the silicon-germanium barrier layers have a thickness in the range of 30 nm and the silicon quantum well has a thickness in the range of 6 nm.

13. A multiple quantum dot device comprising:
   a plurality of semiconductor quantum dot devices formed adjacent to one another in a row, each quantum dot device comprising:
   (i) a multilayer semiconductor structure, on which all of the quantum dot devices are formed, including a substrate, a back gate electrode layer, a quantum well layer, a bottom barrier layer between the quantum well layer and the back gate layer, and a top barrier layer above the quantum well layer;
   (ii) each quantum dot device having a plurality of spaced electrode gates formed on the multilayer semiconductor structure, the electrode gates spaced from each other by a region beneath which the quantum dot may be defined, the electrodes formed to provide a quantum dot having an elongated length and narrow width and an asymmetric confining potential along its length such that orbital excitation of an electron in the quantum dot results in lateral center of charge motion; and
   (iii) each quantum dot device having a single electron sensitive electrometer adjacent to the quantum dot and coupled thereto to detect the change in charge resulting from the lateral movement of the center of charge of an electron changing orbitals in the quantum dot;
   wherein each quantum dot device shares gate electrodes with a quantum dot device next to it.

14. The multiple quantum dot device of claim 13 further including a conductor on the semiconductor structure arranged to carry current in a direction perpendicular to the length of the quantum dot such that current carried by the conductor provides a magnetic field that extends through the quantum dot with a gradient in magnetic field along the length of the quantum dot.

15. The multiple quantum dot device of claim 13 wherein the multilayer semiconductor structure is a heterostructure.

16. The multiple quantum dot device of claim 13 wherein the single electron sensitive electrometer for each quantum dot device comprises a single electron transistor.

17. The multiple quantum dot device of claim 13 further including a microwave radiator and a microwave source connected to the radiator to provide a microwave field to each of the quantum dots.

18. The multiple quantum dot device of claim 17 wherein the microwave generator provides microwaves at a frequency which provides microwave energy equal to the energy splitting between the two orbitals of an electron in the quantum dot of a quantum dot device.

19. The multiple quantum dot device of claim 18 further including means for providing a magnetic field through the quantum dot of each quantum dot device which has a gradient along the length of the quantum dot such that the two orbitals of an electron in the quantum dot have different spin splittings, and wherein the microwave generator provides microwaves at a frequency having an energy selected from the group consisting of the difference between the energy in the two orbitals of up direction spin and the difference between the energy in the two orbitals of down direction spin.

20. The multiple quantum dot device of claim 17 wherein the microwave source is connected to at least one electrode gate for each quantum dot, which acts as the microwave radiator.

21. The multiple quantum dot device of claim 13 wherein the back gate layer is formed of highly doped semiconductor or a quantum well containing electrons.

22. The multiple quantum dot device of claim 13 wherein the quantum well layer is formed of silicon and the top and bottom barrier layers are formed of silicon-germanium.

23. The multiple quantum dot device of claim 22 wherein the silicon-germanium barrier layers have a thickness in the range of 30 nm and the silicon quantum well has a thickness in the range of 6 nm.

24. The multiple quantum dot device of claim 13 further including a source of magnetic field through the quantum dot that is uniform across the quantum dot.

* * * * *

UNITED STATES PATENT AND TRADEMARK OFFICE
CERTIFICATE OF CORRECTION

PATENT NO. : 7,135,697 B2  
APPLICATION NO. : 10/787075  
DATED : November 14, 2006  
INVENTOR(S) : Mark Gregory Friesen et al.

It is certified that error appears in the above-identified patent and that said Letters Patent is hereby corrected as shown below:

Col. 5, lines 9-10: Delete the equation and replace it with

-- $E_o = \sqrt{2I/c\varepsilon_0 \sqrt{\varepsilon_r}}$ --.

Col. 5, line 26, Equation (1): Within the equation, delete "≈" and replace it with -- ≃ --.

Signed and Sealed this

Eleventh Day of December, 2007

JON W. DUDAS  
*Director of the United States Patent and Trademark Office*